June 6, 1967 G. RETZLAFF ETAL 3,324,353

PRINTED CIRCUIT ASSEMBLY

Filed May 17, 1965

Inventors:
Günter Retzlaff
Horst Winkler
Horst Beetz

By: Spencer & Kaye
Attorneys

United States Patent Office 3,324,353
Patented June 6, 1967

3,324,353

PRINTED CIRCUIT ASSEMBLY

Günter Retzlaff, Muhlheim am Main, Horst Winkler, Wirtheim uber Gelnhausen, and Horst Beetz, Frankfurt am Main, Germany, assignors to Licentia Patent-Verwaltungs-G.m.b.H., Frankfurt am Main, Germany Filed May 17, 1965, Ser. No. 456,204
Claims priority, application Germany, May 16, 1964, L 47,826
2 Claims. (Cl. 317—101)

Figure 1A:
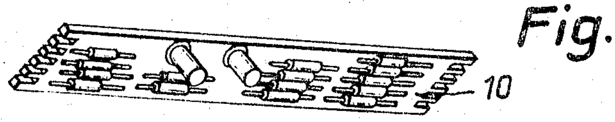

The present invention relates to a printed circuit plug board for constructing complex electrical circuits, and more particularly to such a plug board having two layers, one of which carries the circuit elements and the other of which is a distributor board for controlling current distribution in the circuit elements.

In wiring electrical circuits, it is common practice in the electronics industry to use flat printed circuit boards. Such boards are usually card-like members of insulating material, upon which conductors are laid down forming current paths, as well as plug and solder connections. Such printed circuit boards are sometimes referred to as printed conductor plates, or print plates, or sometimes merely prints. The conductors on the printed circuit boards form circuit paths inter-connecting various circuit elements which are provided on the board.

Conventional print plates, such as has been described, have the disadvantage that they can not be used universally; that is, for each combination of circuit elements or for each functional unit, a circuit board having a predetermined circuit layout has to be provided. This makes it relatively difficult to plan and wire complex devices, and necessitates the storage of many different kinds of circuit boards. These disadvantages are especially noticeable with respect to digital data processing apparatus, such as digital computers, numerical machine tool controllers, etc., since such devices utilize basically a relatively small number of different kinds of functional elements, such as AND-gates OR-gates, inverters and storage units. In any given device, a great number of these basic elements are needed, but they are needed in different combinations. Thus, a great number of different printed circuit boards is required for each device.

It is therefore an object of the present invention to overcome the above-mentioned drawbacks of prior art devices and to provide a printed circuit assembly wherein only a relatively small number of different printed circuits have to be stored.

It is a further object of the present invention to provide a printed circuit assembly wherein from basic printed circuit building blocks, a great number of different assemblies can be made.

It is a further object of the present invention to provide a printed circuit assembly wherein the circuit provided by any given assembly may be changed in a simple manner.

It is still another object of the present invention to provide a printed circuit assembly wherein the specific circuit provided may be easily set up by automatic machines.

These objects, as well as others, are achieved according to the invention by providing two printed plates arranged substantially parallel to each other, one of which is a distributor plate and the other of which is a circuit element plate. The distributor plate carries a matrix of current paths in the form of a "cross-bar distributor," a cross-bar distributor is here defined as a matrix formed by two planes of parallel wires running in longitudinal and transverse directions, respectively, with the two planes of wires being electrically insulated from each other by a plate of insulating material, and the circuit element print plate includes printed circuit conductors interconnecting the various circuit elements mounted thereon, which strips terminate in connection contacts at the ends of the strip. These connection contacts make contact with the transverse parallel current paths on the distributor plate, while the longitudinal conductive paths running across these transverse paths on the distributor plate terminate in plugs or in solder connections for connecting the assembly into a larger circuit. Since the distributor plate is provided with a matrix of current paths, any desired wiring combination of the functional groups mounted on the circuit element strips may be produced by merely joining or open-circuiting various predetermined cross-points of the matrix.

Figure 1A:
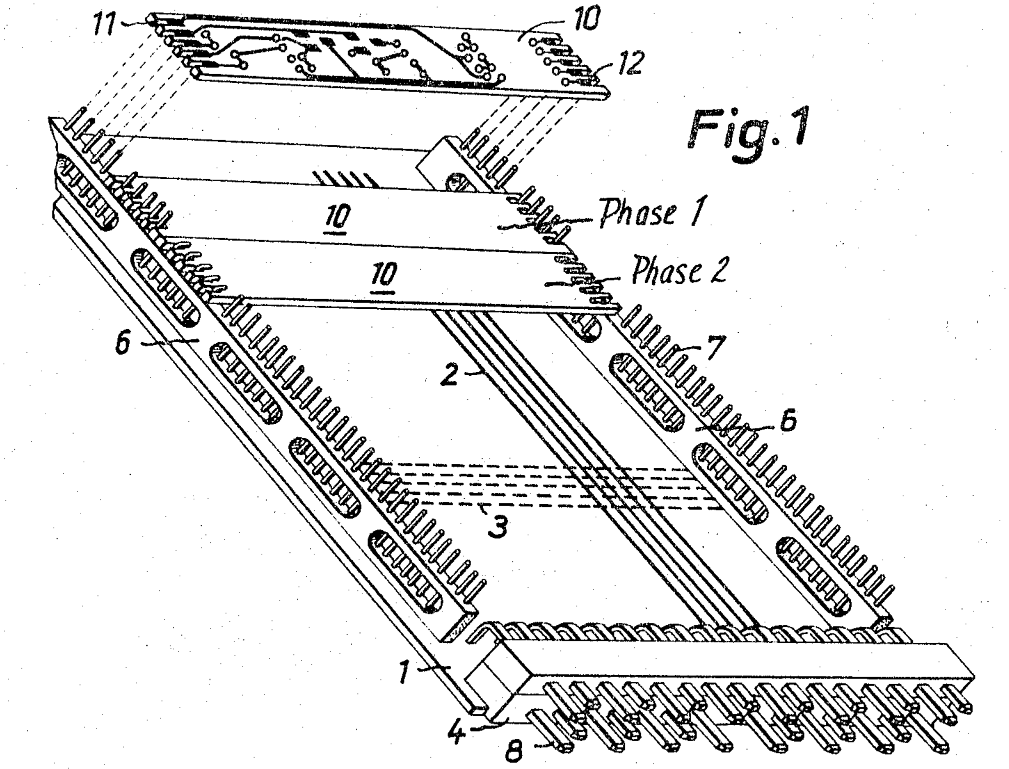
Figure 1A:
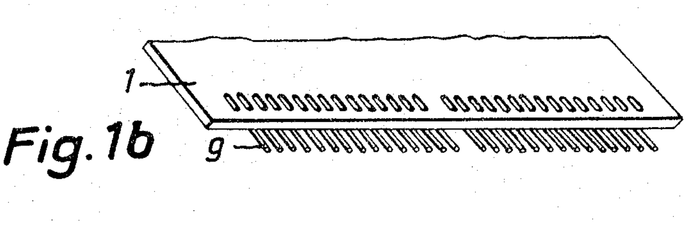

Additional objects and advantages of the present invention will become apparent upon consideration of the following description when taken in conjunction with the accompanying drawings in which:

FIGURE 1 is a perspective view, in partial schematic, showing an embodiment of the invention in various stages of assembly.

FIGURE 1*a* is a plan view showing the underside of strip 10 in FIGURE 1.

FIGURE 1*b* illustrates solder connection wires provided on one end of the plate 1, in place of the plug prong assembly 4, 8 shown in FIGURE 1.

Referring to the drawing, FIGURE 1 shows a print plate 1 which is a distributor plate. This distributor plate is provided with a matrix of current paths which form a cross-bar distributor. Five conductors are shown in each of groups 2 and 3 of conductive paths, which groups run transversely to each other and are applied on opposite sides of the distributor plate.

A plug-prong strip 4 is attached at one end of the distributor plate, by means of which the assembly may be connected into a larger over-all circuit. In place of this plug-prong strip, solder connections 9 may be provided to terminate the group 2 of conductive paths, as shown in FIGURE 1*b*. Whether or not the plug-type connections or the solder connections are used, each is connected to respective one of the longitudinal current paths 2 of the distributor plate. A perforated strip 6 formed of insulating material is fastened to each side of the distributor plate 1, and wire-connecting conductors 7 are provided corresponding to each of the transverse conductors 3 in the distributor matrix. These wires may be soldered into respective conductors in the distributor plate 1.

A second print plate is formed parallel to the distributor print plate, which second plate is made up of several circuit element strips 10, three of which are shown in FIGURE 1 in various stages of assembly. As shown in FIGURE 1*a*, these strips 10 are each provided on one side with circuit elements such as transistors, diodes, resistors and the like, which are interconnected by printed circuit paths on the other side of the strip. At the end of each strip, a series of slots 11 is provided, and on the inner end of each slot is a connection contact 12 connected to a respective conductor in the printed circuit on the back of the strip.

In order to construct a printed circuit assembly according to the invention, strips 10 are first laid on the insulating strips 6 so that the protruding ends of connection wires 7 extend through the slots in the ends of the strips. This is illustrated as "PHASE I" in FIGURE 1. Then, the connection wires 7 are bent over, as shown in "PHASE II" in FIGURE 1, and are soldered to the contacts 12 which they engage.

In the embodiment shown in FIGURE 1, the circuit elements are arranged on that side of the strips facing the distributor plate. This arrangement has the advantage that the solder-connection points for the circuit elements are easily accessible from outside the assembly, which is of great help in inspecting and checking on circuit failures. The assembly may also be formed such that the circuit elements are provided on the exterior surfaces of the strips. This would be advantageous, for instance, in a situation where power dissipation was a problem. In place of the insulating spacers 6 and connection wires 7, which may conveniently be manufactured as a unit, the strips may be electrically connected to the distributor plate by means of prongs provided along the end of each strip. Such prongs may be set in a molding running along the end of each strip and may be electrically connected to the contacts 12. Sockets for receiving such prongs may then be provided along the sides of the distributor plate 1. Alternatively, the sockets may be provided on the strips, and corresponding plug-prongs provided on the distributor plate.

Interconnections among the strips and with the prongs 8 provided on the prong-strip 4 may be carried out according to a desired circuit plan by connecting or not connecting, as desired, predetermined cross points in the matrix on print plate 1. This process may be simply carried out in a simple and logical manner by means of a small numerically coded point-control device. The process can therefore be carried out by hand or controlled by punched tape. As is well-known in the art, the interconnection between longitudinal conductors 2 and transverse conductors 3 can be carried out by drilling holes at the desired matrix cross-cover points and by inserting a conductive pin in each such hole and applying heat to solder or weld the pin to both conductors or, if the plate 1 is sufficiently thin, by spot welding through the plate at the cross-over points at which connections are to be made.

It can be seen from the above description that no matter how many different combinations of functional elements are desired, the same print plates may be used to form the different wiring combinations desired in a very simple operation. This greatly simplifies planning and production of circuit assemblies since there is no necessity to produce different printed circuit patterns according to the functions desired, but merely to set up the current paths by the simple procedure outlined above. The advantages provided by universal assemblies such as this are especially noticeable in the digital data processing art, in which a relatively small number of different kinds of functional elements, such as AND-gates, OR-gates, inverters and storage elements are used. Great numbers of these different functional elements are used in any given circuit, in various combinations and permutations. The present assembly may be suitably constructed so that the circuit elements for one functional element are provided on one strip. By changing connections on the matrix print plate, or cross-bar distributor, according to the desired circuit layout, different logical circuits may be formed. If conventional printed circuit boards were used, a special print plate with predetermined current paths would have to be made corresponding to each and every one of the desired circuits.

The assembly provided according to the invention has the further advantage that changes in wiring, which may for example be necessary due to changes to be made in the circuitry, or to errors in planning, may be accomplished very simply. A further advantage provided by the invention is that in case of failure of one or more of the circuit elements, individual strips may be easily replaced by relatively unskilled personnel, since they need not be capable of understanding the circuit layout. It should be noted, furthermore, that the spatial requirements of assemblies provided according to the invention are relatively low, in spite of the fact that two print plates are used, since the density of circuit elements is relatively high.

It will be understood that the above description of the present invention is susceptible to various modifications, changes, and adaptations, and the same are intended to be comprehended within the meaning and range of equivalents of the appended claims.

What is claimed is:

1. A printed circuit assembly for wiring electrical circuit elements together into composite circuits, said assembly comprising, in combination:

(a) a distributor print plate means provided with a matrix of conductive paths, and contact means disposed at one end of said distributor plate means, said paths including a first group of printed circuit conductors terminating in said contact means, and a second group of printed circuit conductors transverse to said first group;

(b) means forming a circuit element print plate spaced from and substantially parallel to said distributor plate means and formed of a plurality of substantially coplanar printed circuit strips the ends of which correspond to those sides of said distributor plate means adjacent said one end, each said printed circuit strip including a printed circuit thereon terminating in at least one connection on each end of said strip and each said strip having at least one circuit element mounted thereon and connected in said printed circuit, each of said printed circuit element strips having slots formed at each end thereof within which said connections are provided; and (c) means electrically connecting said connections of said strips to corresponding conductors in said second group, whereby said strips may be interconnected and connected with said contact means by connecting together various conductors of said first and second groups at predetermined cross points of said matrix of conductive paths, said electrically connecting means including a pair of insulating strips each provided between a respective one of the sides of said distributor plate means adjacent one end thereof and the corresponding side of said circuit element print plate, and a set of connecting conductors extending through each of said insulating strips, one end of each said connecting conductor being soldered to a respective conductor of said second conductor group and the other end of each said connecting conductor extending through a respective one of said slots and being soldered to a respective one of said connections provided therein.

2. An arrangement as defined in claim 1, wherein said distributor plate means and said circuit element plate are rectangular and said insulating strips are provided between corresponding longitudinal sides of said distributor plate means and said circuit element plate.

References Cited

UNITED STATES PATENTS

| | | | |
|---|---|---|---|
| 2,872,664 | 2/1959 | Minot | 317—101 X |
| 2,907,926 | 10/1959 | Slack | 317—101 |

OTHER REFERENCES

Electronics, vol. 34, No. 26, June 30, 1961, page 108.

ROBERT K. SCHAEFER, *Primary Examiner.*

W. C. GARVERT, R. S. MACON, *Assistant Examiners.*